United States Patent [19]

Zajac

[11] Patent Number: 5,063,783
[45] Date of Patent: Nov. 12, 1991

[54] PRESSURE MONITORING AND METHOD

[76] Inventor: John Zajac, 1137 Angmar Ct., San Jose, Calif. 95121

[21] Appl. No.: 567,191

[22] Filed: Aug. 14, 1990

[51] Int. Cl.$^5$ ............................................. G01L 7/00
[52] U.S. Cl. .................................................. 73/714
[58] Field of Search ................. 73/714, 700, 302, 714, 73/298

[56] References Cited

U.S. PATENT DOCUMENTS

| | | | |
|---|---|---|---|
| 1,100,867 | 6/1914 | Dexter | 73/702 |
| 3,246,522 | 4/1966 | Rapson | 73/700 |
| 3,659,459 | 5/1972 | Moreau | 73/700 |
| 3,721,126 | 3/1973 | Beals et al. | 73/700 |

Primary Examiner—Donald O. Woodiel
Attorney, Agent, or Firm—Flehr, Hohbach, Test, Albritton & Herbert

[57] ABSTRACT

System and method for monitoring gas pressure in semiconductor processing equipment and the like. A small backflow of an inert gas is passed through the monitoring system to isolate the system from corrosive gases in a chamber to which the system is connected. The backflow passes through a flow restrictor of known resistance between a pressure sensor and the chamber, and the drop in pressure across the restrictor is determined and combined with the pressure measured by the sensor to determine the pressure in the chamber.

6 Claims, 1 Drawing Sheet

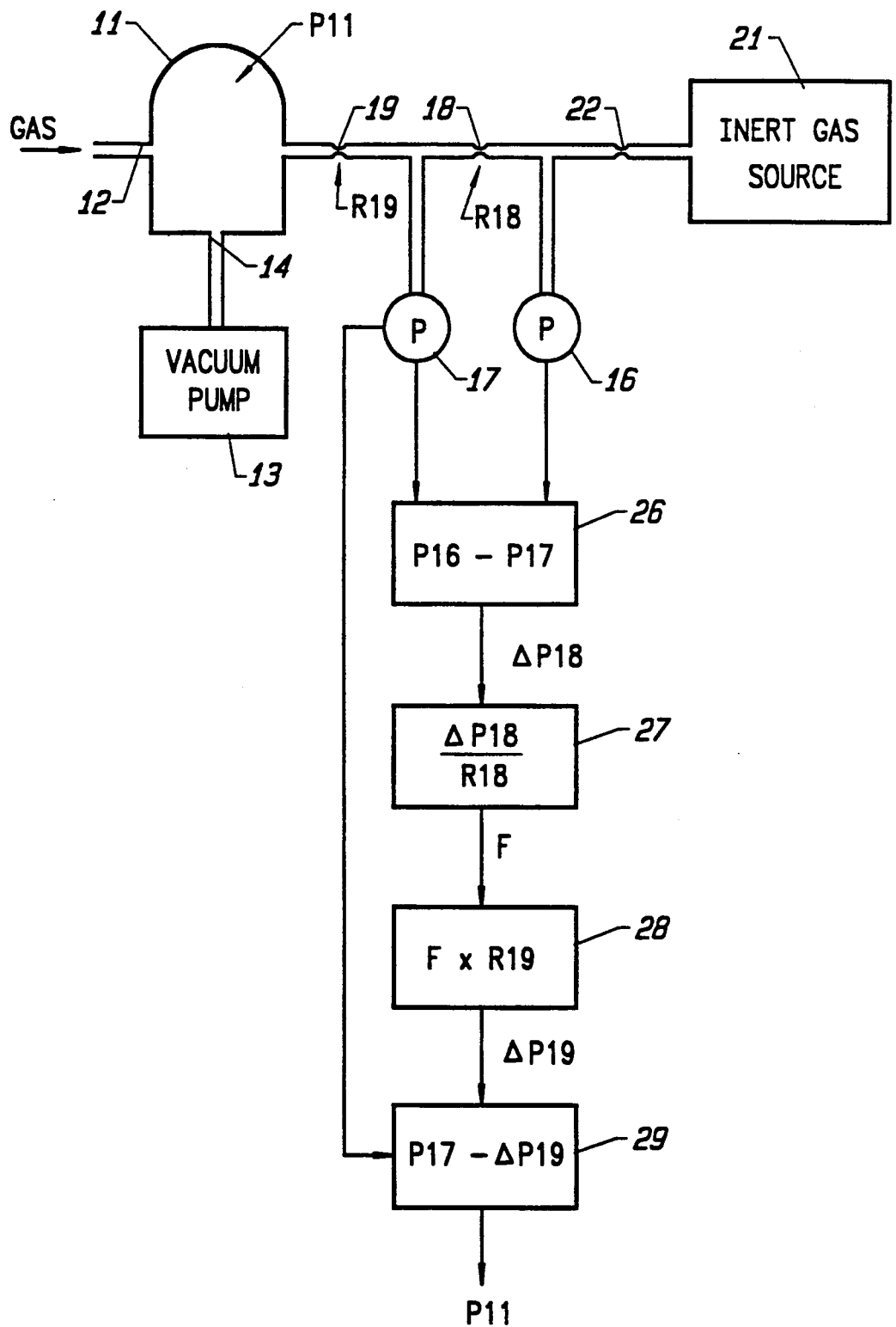

PRESSURE MONITORING AND METHOD

This invention pertains generally to pressure monitors and, more particularly, to a system and method for monitoring gas pressure in a reactor chamber.

Capacitance manometers are widely used for monitoring pressure in the processing of semiconductor wafers. These devices, however, have a number of limitations and disadvantages. They are relatively expensive because they must be fabricated of materials such as stainless steel having a high chrome content in order to resist the corrosive gases which are commonly present in semiconductor processing reactors, e.g. $AlCl_3$, $Cl_2$, $F_2$, HF and HCl. Thermal stresses associated with the manufacturing process can result in changes in diaphragm characteristics which affect the accuracy of the gauges. These devices also tend to be temperature and attitude sensitive, as well as requiring a relatively long warm-up time. In addition, the calibration of a capacitance manometer can be destroyed by subjecting the device to atmospheric pressure, and a positive pressure of as little as 5 psig can severely damage the gauge.

Another type of pressure sensor which is utilized in some applications is an ion gauge. However, the corrosive gases which are present in semiconductor processing tend to destroy ion gauges, which makes them unsuitable for use in such applications.

It is in general an object of the invention to provide a new and improved pressure monitoring system and method which overcome the limitations and disadvantages of the systems heretofore provided.

Another object of the invention is to provide a system and method of the above character which are particularly suitable for use in semiconductor processing applications.

These and other objects are achieved in a accordance with the invention by providing a pressure monitoring system and method in which a small backflow of an inert gas is passed through the monitoring system to isolate the system from corrosive gases in a chamber to which the system is connected. The backflow passes through a flow restrictor of known resistance between a pressure sensor and the chamber, and the drop in pressure across the restrictor is determined and combined with the pressure measured, by the sensor to determine the pressure in the chamber.

The single figure of drawing is a functional block diagram of one embodiment of a pressure monitoring system according to the invention.

In the drawing, the invention is illustrated in connection with a reactor chamber 11 of the type commonly employed in the processing of semiconductor wafers. Gases are supplied to the chamber from a suitable source (not shown) connected to an inlet port 12 and removed by a vacuum pump 13 connected to an exhaust port 14. The rate of gas flow to and from the reactor is dependent upon the process carried out in the reactor. For a plasma etching process, for example, the gas flow is typically on the order of 50–500 cc/min, whereas for a chemical vapor deposition process, it might be on the order of 5–5,000 cc/min.

The monitoring system includes a pair of pressure sensors 16, 17 which can be pressure gauges or other sensors of known design for monitoring gas pressures on the order of 0.1–1000 microns. Suitable sensors include Pirani gauges and ion gauges among others.

A first flow restrictor 18 is connected between the two sensors, and a second flow restrictor 19 is connected between sensor 17 and the reactor chamber. The restrictors provide a resistance to flow which is dependent upon the size of an orifice or passageway within the restrictors and is therefore known. The restrictors can be of any suitable type, and in the embodiment illustrated, each of them comprises a section of $\frac{1}{8}$ inch line, with the resistances provided by the two restrictors being equal.

A source 21 of inert gas is connected to the junction of sensor 16 and flow restrictor 18 by a third flow restrictor 22 which provides a flow resistance selected to reduce the pressure from the source to the level desired for the backflow through the system. The amount of flow is dependent upon the size of the sensing lines, and varies in proportion to the square of the radius of the line. With a line having a diameter of $\frac{1}{8}$ inch, for example, a flow is on the order of 0.001–5.0 cc/min is sufficient to protect the sensors from the corrosive gases in the reactor yet insignificant in comparison with the flow rates in the reactor. With larger or smaller lines, the flow rate would be larger or smaller. Suitable inert gases include $N_2$, He, Ar and other gases which will not attack the pressure sensors or affect the process being carried out in the reactor.

The system also includes means 26, 27 responsive to the pressures (P16, P17) sensed by pressure sensors 16, 17 and to the resistance (R18) provided by flow restrictor 18 for determining the rate of flow (F) through restrictors 18, 19; means 28 responsive to the flow rate (F) and the resistance (R19) provided by the second flow restrictor for determining the drop in pressure ($\Delta P19$) across flow restrictor 19; and means 29 for combining the pressure drop ($\Delta P19$) across flow restrictor 19 with the pressure (P17) sensed by pressure sensor 17 to determine the pressure (P11) in chamber 11.

Elements 26–29 are illustrated in functional block form and perform the arithmetic functions indicated therein. Thus, the pressure (P17) read by sensor 17 is subtracted from the pressure (P16) read by sensor 16 to determine the drop in pressure ($\Delta P18$) across flow restrictor 18, and this drop in pressure is divided by the resistance (R18) of restrictor 18 to determine the flow rate (F) through the restrictors. The flow rate (F) is multipled by the resistance (R19) of flow restrictor 19 to determine the drop in pressure ($\Delta P19$) across that flow restrictor, and this pressure drop is subtracted from the pressure (P17) measured by sensor 17 to determine the pressure (P11) in the chamber.

Operation and use of the monitoring system, and therein the method of the invention, are as follows. A small amount of inert gas from source 21 flows through restrictors 22, 18 and 19 to chamber 11, preventing gases from the chamber from entering the monitoring system. The drop in pressure ($\Delta P18$) across restrictor 18 is determined by subtracting the pressure (P17) read by sensor 17 from the pressure (P16) read by sensor 16, and the flow rate (F) though the system is determined by dividing the drop in pressure ($\Delta P18$) by the resistance (R18) of the restrictor.

Once the flow rate (F) is determined, the drop in pressure ($\Delta P19$) across restrictor 19 is determined by multiplying this rate by the resistance (R19) of restrictor 19. Alternatively, in a system in which the flow resistances of restrictors 18 and 19 are equal, the drop across restrictor 19 will be equal to the drop across restrictor 18, and can be determined simply by subtracting the readings of the two sensors.

Once the pressure drop ($\Delta P19$) across flow restrictor 19 is known, the pressure (P11) in the chamber is determined by subtracting this drop from the reading (P17) of sensor 17.

It should be noted that the pressure measurements and calculations are made on an instantaneous basis, with the result that any changes in supply pressure are automatically cancelled out and do not affect the final readings. This means that the gas source does not have to be ideal or perfect and permits an unregulated source to be used.

Alternatively, a regulated source or a mass flow controller can be employed to supply the inert gas to the system, in which case pressure sensor 16 can be eliminated since the pressure at that point in the system will be known.

The invention has a number of important features and advantages. The small backflow of inert gas prevents corrosive gases from entering the monitoring system and permits the use of relatively inexpensive gauges for monitoring pressure. No damaging deposition can occur on the sensors because they are protected by the prophylactic backflow. The system is relatively insensitive to changes in ambient temperature, and with sensors such as Pirani gauges or ion gauges, it is not sensitive to attitude at pressures less than about 1000 microns. With no moving parts and no hysteresis, the system is substantially free from drift, and it require almost no warm-up time. No miscalibration is caused by venting to atmosphere, and the system is not damaged by over-pressurization.

It is apparent from the foregoing that a new and improved pressure monitoring system and method have been provided. While only certain presently preferred embodiments have been described in detail, as will be apparent to those familiar with the art, certain changes and modifications can be made without departing from the scope of the invention as defined by the following claims.

I claim:

1. In a system for monitoring pressure in a reactor chamber: a pressure sensor, a flow restrictor connected between the sensor and the chamber, means for introducing a relatively small gas flow into the chamber through the flow restrictor, means for determining the drop in gas pressure across the flow restrictor, and means for combining the pressure drop across the flow restrictor with the pressure sensed by the sensor to determine the pressure in the chamber.

2. In a system for monitoring pressure in a reactor chamber: first and second pressure sensors, a first flow restrictor connected between the pressure sensors, a second flow restrictor connected between the second pressure sensor and the chamber, means for introducing a small amount of gas into the chamber through the restrictors, means responsive to the relative pressures sensed by the first and second pressure sensors and to the resistance provided by the first flow restrictor for determining the rate of flow through the restrictors, means responsive to the flow rate and the resistance provided by the second flow restrictor for determining the drop in pressure across the second flow restrictor, and means for combining the pressure drop across the second flow restrictor with the pressure sensed by the second sensor to determine the pressure in the chamber.

3. In a method of monitoring pressure in a reactor chamber, the steps of: introducing a relatively small gas flow into the chamber through a flow restrictor, monitoring the pressure on the side of the restrictor opposite the chamber, determining the drop in pressure across the flow restrictor, and combining the pressure drop across the flow restrictor with the pressure monitored on the side of the flow restrictor opposite the chamber to determine the pressure in the chamber.

4. The method of claim 3 wherein the flow restrictor has a diameter on the order of $\frac{1}{8}$ inch, and the gas flow is introduced through the restrictor at a rate on the order of 0.001–5.0 cc/min.

5. In a method of monitoring pressure in a reactor chamber, the steps of: introducing a small amount of gas into the chamber through first and second flow restrictors, monitoring the pressure on one side of the first flow restrictor and at a point between the two flow restrictors, determining the rate of flow through the flow restrictors from the pressures monitored on the one side of the first flow restrictor and at the point between the two flow restrictors and from the resistance provided by the first flow restrictor for determining the rate of flow through the restrictors, determining the drop in pressure across the second flow restrictor from the rate of flow through the flow restrictors and the resistance provided by the second flow restrictor, restrictor, and combining the pressure drop across the second flow restrictor with the pressure sensed at the point between the two flow restrictors to determine the pressure in the chamber.

6. The method of claim 5 wherein the gas is introduced into the chamber at a rate on the order of 0.001–5.0 cc/min.

* * * * *